Aug. 31, 1965 R. A. POLIZZI 3,204,196

GATED CRYSTAL OSCILLATOR

Filed Oct. 4, 1961 2 Sheets-Sheet 1

INVENTOR.
RAYMOND A. POLIZZI,
BY Robert H. Himes
ATTORNEY.

GATED CRYSTAL OSCILLATOR

Filed Oct. 4, 1961

INVENTOR.
RAYMOND A. POLIZZI,
BY Robert H. Himes
ATTORNEY.

3,204,196
Patented Aug. 31, 1965

3,204,196

GATED CRYSTAL OSCILLATOR

Raymond A. Polizzi, Anaheim, Calif., assignor to Hughes Aircraft Company, Culver City, Calif., a corporation of Delaware Filed Oct. 4, 1961, Ser. No. 142,983
6 Claims. (Cl. 331—54)

This invention relates to gated crystal oscillators and more particularly to an apparatus incorporating a shock excited crystal for providing a constant amplitude output wave train of predetermined frequency that is phase-locked with a random input trigger pulse and which may be re-excited within less than 20 microseconds subsequent to the apparatus being switched off.

Present day shock excited crystal oscillators generally commence oscillations at some arbitrary point of the sine wave cycle and generate damped oscillations whereby the number of oscillations of finite amplitude which can be produced in response to a particular trigger pulse is limited. In addition, it is often difficult to make a conventional crystal oscillator cease and commence oscillations within a short interval of time.

It is therefore an object of the present invention to provide an improved phase-locked gated crystal oscillator.

Another object of the present invention is to provide a gated crystal oscillator which commences oscillations at zero amplitude point on the sine wave cycle.

Still another object of the present invention is to provide a gated crystal oscillator capable of ceasing oscillations and be capable of commencing oscillations within an interval of time less than 20 microseconds.

A further object of the present invention is to provide a gated crystal oscillator capable of producing oscillations of constant amplitude for indefinite periods of time.

In accordance with the present invention, a trigger pulse is applied to a blocking oscillator to generate a high energy pulse of predetermined width and amplitude. This high energy pulse is in turn applied through a transformer to a crystal oscillator circuit. The width of the high energy pulse and the resonant frequency of the transformer are designed to transfer maximum excitation energy to the crystal oscillator with a minimum constant delay from the input trigger pulse.

In order for the disclosed gated crystal oscillator to be phase-locked with succeeding trigger pulses, it is necessary to remove energy from the crystal at the end of the gate period so that it will be ready for the next random trigger pulse. This is accomplished by connecting a "negative feed-back driver" across the primary winding of the aforementioned transformer. This negative feedback driver presents a low impedance across the primary winding of the transformer during the gated intervals thereby reducing the effective Q of the transformer winding dissipating any stored energy therein. In particular, the negative feedback driver constitutes a transistor network which is saturated during gated intervals thereby presenting a low impedance to the primary winding of the transformer which in turn minimizes the effect of the resonance of the transformer upon the frequency of oscillation established by the crystal. Lastly, when it is desired to stop the oscillations, the negative feedback driver operates as a class-A amplifier to apply negative feedback through the transformer to the crystal to dampen the oscillations.

The above-mentioned and other features and objects of this invention and the manner of obtaining them will become more apparent by reference to the following description taken in conjunction with the accompanying drawings, wherein.

Figure 1:
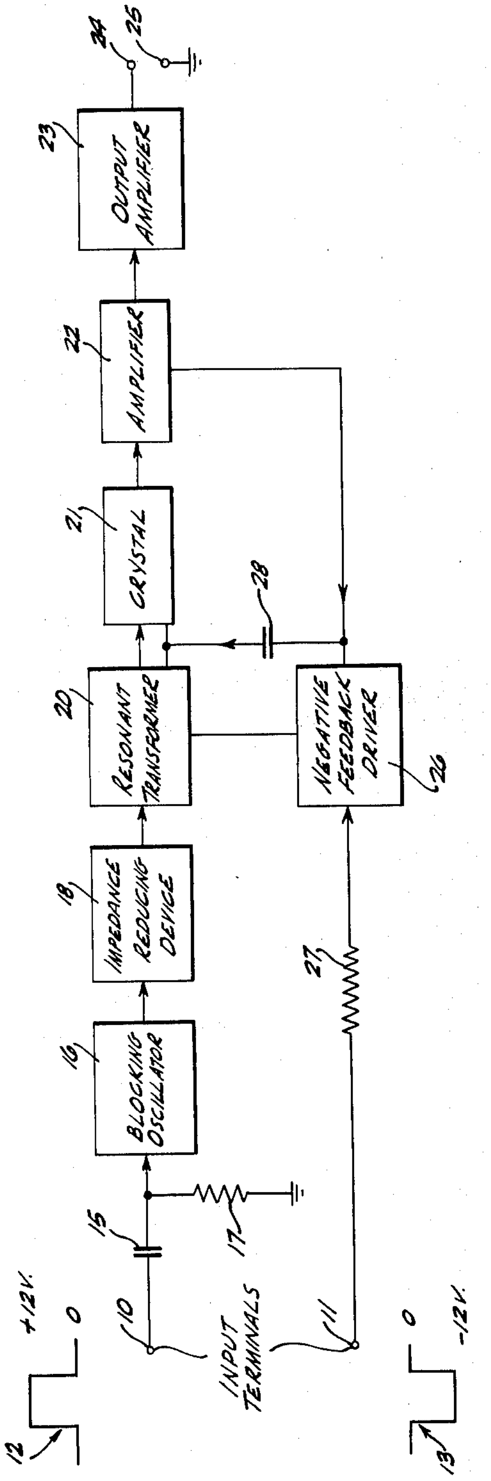
FIG. 1 is a flow diagram of an embodiment of the present invention.

Referring now to FIG. 1 of the drawings, there is shown a schematic block diagram of an embodiment of the invention. In particular, the apparatus possesses input terminals 10 and 11 adapted to be responsive to complementary signals illustrated by voltage waveforms 12 and 13, respectively. At the commencement of the gated intervals, waveform 12 undergoes a positive excursion from 0 to +12 volts while waveform 13 concurrently undergoes a negative excursion from 0 to −12 volts. During the gated intervals these voltages are maintained and at the end of gated intervals both waveforms 12, 13 return to zero volts. A capacitor 15 is connected from the input terminal 10 to the input of a blocking oscillator 16. In addition, a resistor 17 is connected from the input of blocking oscillator 16 to ground. The time constant of the capacitance of capacitor 15 in conjunction with the resistance of resistor 17 is sufficiently short so as to differentiate the input voltage waveform 12. Capacitor 15, for example, may be of the order of 220 micromicrofarads while the resistor 17 is of the order of 68,000 ohms.

In response to positive excursions of the differentiated waveform 12, the blocking oscillator 16 generates a pulse of predetermined width which is applied through an impedance reducing device 18 to the primary winding of a resonant transformer 20. In particular, the width of the pulse generated by blocking oscillator 16 is designed to be substantially equal to one-quarter period at the resonant frequency of transformer 20 so that the fundamental frequency component of the pulse corresponds to the resonant frequency of the transformer. A balanced output of resonant transformer 20 is then employed to shock excite a crystal 21, the output of which is amplified in cascade by an amplifier 22 and an output amplifier 23, the amplifier 23 having output terminals 24 and 25, of which output terminal 25 is referenced to ground. The amplifier 22 includes an additional feedback stage wherein the signal drives a transistor to saturation whereby the amplitude of the feedback signal remains substantially constant. A capacitor 28 responsive to the constant amplitude feedback signal from amplifier 22 and coupled to the balanced output of resonant transformer 20 is used to provide positive feedback in order to sustain crystal oscillations over long periods of time during gated intervals or when sustained oscillations are desired.

In addition to the foregoing, a negative feedback driver 26 has a first input connected through a resistor 27 to the input terminal 11 and a second input responsive to the constant amplitude feedback signal provided by amplifier 22. The negative feedback driver in turn is connected across the input of resonant transformer 20. During gated intervals defined by voltage waveforms 12, 13, the negative feedback driver 26 produces a low impedance across the input of transformer 20 whereby the resonant characteristics thereof are broadened and have minimum effect on determining frequency of oscillation of the crystal 21. On the other hand, at the termination of the gated intervals defined by voltage waveform 13, the bias applied to driver 26 converts the operation thereof to that of a class-A amplifier whereby oscillations of the crystal 21 are fed back degeneratively through the resonant transformer 20 thereby to dampen the oscillations of crystal 21.

Figure 2:
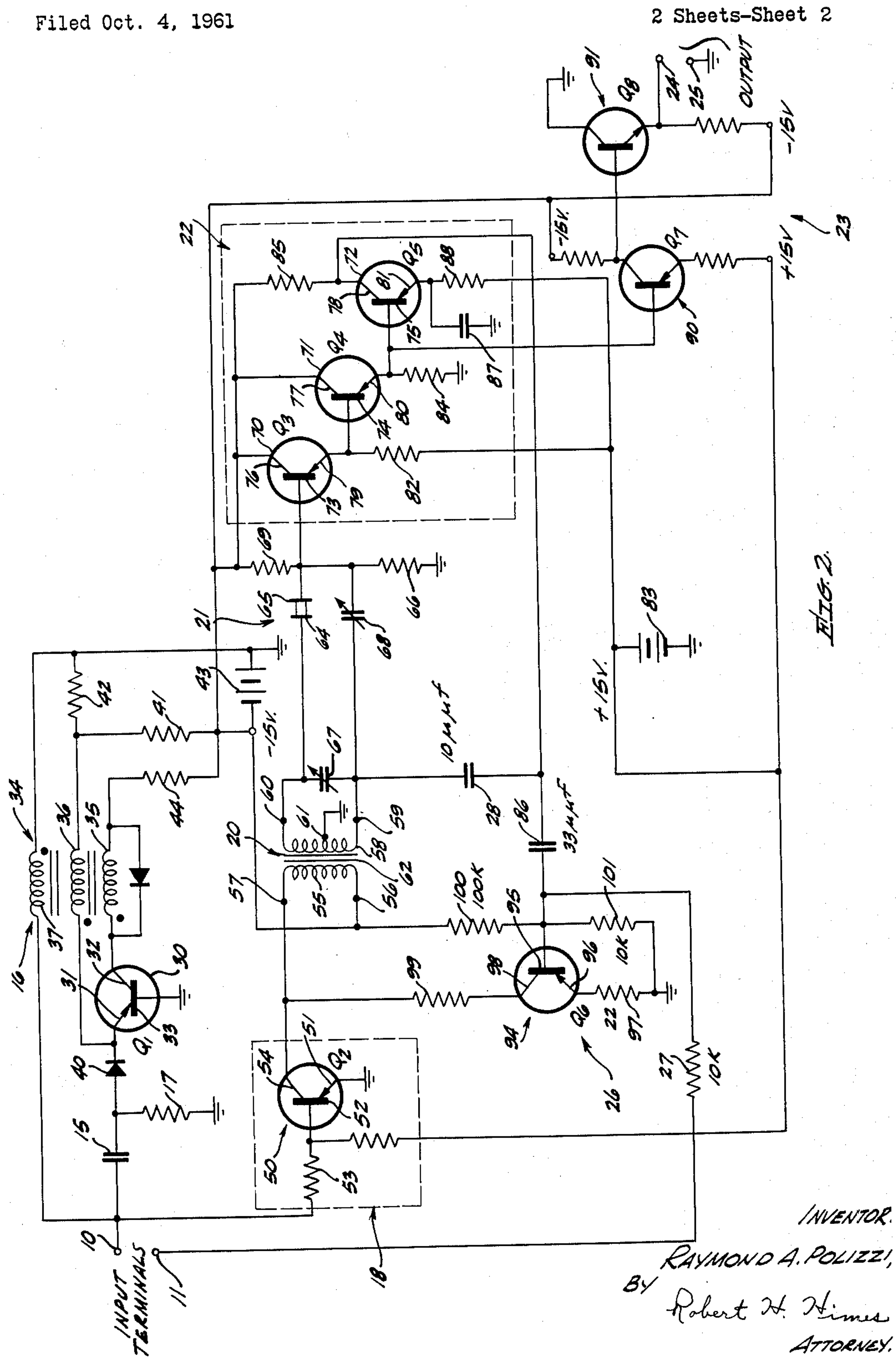
FIG. 2 is a schematic circuit diagram of the apparatus of FIG. 1.

Referring now to FIG. 2 of the drawings, there is shown a schematic circuit diagram of the apparatus of FIG. 1. In particular, the blocking oscillator 16 includes a transistor 30 having an emitter 31, a collector 32 and a base 33, the base 33 being connected to ground; and a pulse transformer 34 having windings 35, 36 and 37, the windings 35, 36, as shown in the drawing, being poled in a direction opposite to that of winding 37. The capacitor 15 is connected through a diode 40 to the emitter 31 of transistor 30 and, in addition, is connected through winding 36 of pulse transformer 34 to a junction between resistors 41 and 42 which form a resistor dividing network across a source of negative potential provided by a battery 43 having the positive terminal thereof connected to ground. The battery provides a potential, for example, of the order of −15 volts relative to ground and the diode 40 is poled so as to allow only positive excursions of potential to appear on the emitter 31 of transistor 30. Next, the collector 32 of transistor 30 is connected through the winding 35 of pulse transformer 34 and thereafter through a resistor 44 to the negative terminal of the battery 43. The resistors 41, 42 have ohmic value, for example, of 4700 ohms and 56 ohms, respectively, and resistor 44 has an ohmic value of 10 ohms. Lastly, the winding 35 of pulse transformer 34 is shunted with a diode which is poled in a direction to allow current to flow towards the collector 32 of transistor 30. An output from the blocking oscillator 16 is provided by the winding 37 of pulse transformer 34. This winding 37 has an extremity referenced to ground and a remaining extremity poled to generate a negative output pulse connected to the input of the impedance reducing device 18.

The impedance reducing device 18 includes a transistor 50 having an emitter 51 connected to ground, a base 52 connected through a resistor 53 to the winding 37 and a collector 54 connected to the resonant transformer 20. The resistor 53 has an ohmic value, for example, of 220 ohms. The resonant transformer 20 has a primary winding 55 having input terminals 56 and 57, a secondary winding 58 having output terminals 59 and 60, a center tap 61 which is connected to ground, and a core 62. The input terminal 56 of primary winding 55 is connected to the negative terminal of battery 43 and the input terminal 57 is connected to the collector 54 of transistor 50 whereby a potential of the order of −15 volts relative to ground is applied thereto. In accordance with the present invention, the characteristics of the transformer 20 must provide resonance at the required frequency of oscillation. In a device which oscillates at 1311.4 kilocycles, for example, the transformer 20 may have a turns ratio of 4:21 and a primary inductance of 20.3 microhenries. The secondary winding 58 is preferably wound in a bifilar manner and the core 62 is preferably constituted of a ferrite material known commercially as Ferrox Cube 4E5626110.

The crystal 21 includes electrodes 64 and 65, the electrode 65 being connected through a resistor 66 of the order of 68,000 ohms to ground. The remaining electrode 64 is connected to the output terminal 60 of secondary winding 58 of transformer 20. A variable capacitance 67 which is adjustable from 5 to 17 micromicrofarads is connected across the output terminals 59, 60 of secondary winding 58 of transformer 20 to adjust the resonant frequency of the secondary winding 58. In addition, a variable capacitor 68 which is adjustable from 0.8 to 12 micromicrofarads is connected from the output terminal 59 of secondary winding 58 to the electrode 65 of crystal 21 for the purpose of completing and balancing the bridge circuit formed with the two halves of secondary winding 58, variable capacitor 67 and crystal 21. Lastly, the electrode 65 of crystal 21 is connected through a resistor 69 which has an ohmic value of the order of 680,000 ohms to the negative terminal of battery 43.

The transistor amplifier 22 comprises transistors 70, 71 and 72 which include, respectively, bases 73, 74 and 75, collectors 76, 77 and 78, and emitters 79, 80 and 81. The base 73 of transistor 70 is connected to the electrode 65 of crystal 21, the collector 76 is connected to the negative terminal of battery 43, and the emitter 79 is connected to the base 74 of transistor 71 and through a resistor 82 having a resistance of the order of 150,000 ohms to the positive terminal of a battery 83, the negative terminal of which is referenced to ground. The battery 83 provides a potential, for example, of the order of +15 volts relative to ground. Next the collector 77 of transistor 71 is connected to the negative terminal of the battery 43, the emitter 80 is connected through a resistor 84 of an ohmic value of the order of 1000 ohms to ground, to the base 75 of transistor 72 and in addition is connected to the input of output amplifier 23. Lastly, the collector 78 of transistor 72 is connected through a collector load resistor 85 to the negative terminal of battery 43 and through a capacitor 86 to the negative feedback driver 26. The emitter 81, on the other hand, is bypassed to ground through a capacitor 87 and is connected through a resistor 88 of ohmic value of the order of 4700 ohms to the positive terminal of the battery 83. The capacitor 87, for example, has a capacitance of the order of 0.01 microfarads. The output transistor amplifier 23 includes transistors 90, 91 which are connected and function in a conventional manner.

Lastly, the negative feedback driver 26 constitutes a transistor 94 having a base 95 connected to the capacitor 86, an emitter 96 connected through a resistor 97 to ground and a collector 98 connected through a resistor 90 to input terminal 57 of primary winding 55 of resonant transformer 20. The resistors 97, 99 has ohmic values, for example, of 22 and 470 ohms, respectively. Also, a resistor 100 is connected from the negative terminal of battery 43 to the base 95 and a resistor 101 is connected from the base to ground thereby forming a resistor dividing network. The resistors 100 and 101 have ohmic values, for example, of 100,000 and 10,000 ohms, respectively. Input terminal 11 is connected through the resistor 27 having an ohmic value of the order of 10,000 ohms to the base 95 of transistor 94 and capacitor 28 is connected from output terminal 59 of secondary winding 58 of resonant transformer 20 to collector 78 of transistor 72.

In the operation of the device of the present invention, voltage waveforms 12, 13 are applied to the input terminals 10, 11, respectively. During non-gated periods of time each of the voltage waveforms 12, 13 are substantially equal to zero volts relative to ground. In the case of voltage waveform 12, however, blocking capacitor 15 makes it possible to employ any reference voltage, it being only necessary that there be a positive excursion of the order of 12 volts at the commencement of a gated interval. In any event, no signal passes through blocking capacitor 15 during non-gated portions of the waveform 12 except as a result of the negative excursion at the termination of a gated interval. This negative excursion, however, is isolated from the blocking oscillator 16 by the diode 40.

The voltage waveform 13 applied at input terminal 11, however, determines the mode of operation of the negative feedback driver 26. In particular, the voltage waveform 13 is applied through the resistor 27 of ohmic value of the order of 10,000 ohms to base 95 of transistor 94. In addition, a potential of the order of −15 volts relative to ground is applied from the battery 43 through resistor 100 to the base 95 and from base 95 through resistor 101 to ground. As previously specified, resistor 100 has an ohmic value of the order of 100,000 ohms and the resistor 101 has an ohmic value of 10,000 ohms; thus during non-gated intervals, resistor 100 in combination with resistors 101, 27 in parallel form a resistor dividing network from −15 volts to substantially zero volts. The net effect of the resistor dividing network is to develop a voltage of the order of −0.7 volts at the base 95 of transistor 94, the emitter 96 being connected through resistor 97 to ground which is of the order of 22 ohms, remains at substantially zero volts relative to ground. Collector 98, on the other hand, is connected through resistor 99 which is of the order of 470 ohms through the primary winding 55 of transformer 20 to the negative terminal of battery 43. Thus, when current is flowing through resistor 97, resistor 94 and resistor 99, a potential of the order of −9.5 volts relative to ground, appears at the collector 98. In view of the potentials applied to the base 95, the emitter 96 and the collector 98 of transistor 94 during non-gated intervals, it is apparent that the transistor 94 operates as a Class-A amplifier during these intervals. During the gated portions of the intervals, however, the potential of voltage waveform 13, applied to input terminal 11, decreases from zero to −12 volts relative to ground. This voltage divides across resistors 27, 101 whereby a voltage of −0.7 volts relative to ground appears at the base 95 of transistor 94. This being the case, current flows to the collector 98 to the extent that the transistor 94 becomes saturated thereby producing a low impedance across the input terminals 56, 57 of primary winding 55 of resonant transformer 20. This low impedance broadens out the resonant characteristic of the transformer 20 and thereby decrease in effect on controlling the frequency of oscillation of the crystal 21.

At the commencement of a gated interval, the voltage waveform 12 undergoes a positive excursion of the order of 12 volts. This positive excursion is differentiated by the action of capacitor 15 in conjunction with resistor 17 to produce a positive pulse. This positive pulse is applied through the diode 40 to the emitter 31 of transistor 30 of the blocking oscillator 16 thereby to initiate the generation of a pulse which appears across the output winding 37 of pulse transformer 34 and is applied through the resistor 53 to the base 52 of transistor 50. The pulse thus generated across the winding 37 is of negative polarity at the input of the impedance reducing device 18 and thus cause the transistor 50 to conduct which in turn applies the pulse across the primary winding 55 of the resonant transformer 20. As previously specified, the width of the pulse applied across transformer 20 is substantially equal to one-quarter period of the frequency of oscillation of the crystal 21 and the resonant frequency of the transformer 20. This pulse which shocks the crystal 21 into oscillation appears equally across the crystal 21 and the variable capacitor 68 whereby no pulse appears across resistor 66. During this period the transistor 94 of the negative feedback driver 26 is biased to saturation and, hence, presents a very low impedance across the primary winding 55 of transformer 20.

The oscillations generated by crystal 21 are amplified by the amplifier 22 and the output amplifier 23 and become available at the output terminals 24, 25. The amplifier 22 and output amplifier 23 operate in a conventional manner with the exception that transistor 72 saturates whereby the regenerative signal fed back through capacitor 28 is of a constant amplitude.

At the termination of a gated interval, the voltage waveform 12 undergoes a negative excursion which results in a negative pulse being generated across the resistor 17. This negative pulse, however, is isolated from the transistor 30 by the diode 40. The return of the voltage waveform 13 to substantially zero volts, however, biases the base 95 of transistor 94 of the negative feedback driver 26 to a level where the transistor 94 again functions as a Class-A amplifier. This negative feedback driver 26 amplifies the feedback signal from amplifier 22 and applies it across the primary winding 55 of resonant transformer 20. This feedback signal is of a phase to dampen the oscillations of the crystal 21 thereby causing the oscillations thereof to decrease to substantially zero in a minimum length of time.

Although the invention has been shown in connection with a certain specific embodiment, it will be readily apparent to those skilled in the art that various changes in form and arrangement of parts may be made to suit requirements without departing from the spirit and scope of the invention.

What is claimed is:

1. An oscillator apparatus capable of being gated on for selected intervals of time, said apparatus comprising a crystal adapted to be shocked into oscillation at a predetermined frequency; means for generating an energizing waveform having a voltage excursion in one direction and a subsequent voltage excursion in a direction opposite to said one direction within an interval of time less than one-half period at said predetermined frequency; a transformer having primary and secondary windings, said transformer having a resonant characteristic at a frequency substantially equal to said predetermined frequency; apparatus including said crystal and said secondary winding of said transformer connected to form a bridge circuitry, said primary winding of said transformer being responsive to said energizing waveform thereby to shock said bridge circuit into oscillation; means responsive to said oscillations and coupled to said bridge circuit for producing a regenerative feedback signal of substantially constant amplitude, said regenerative feedback signal being applied directly to said bridge circuit; and means responsive to a gating signal and to said regenerative feedback signal for providing degenerative feedback applied through said transformer to said bridge circuit commencing with the termination of each of said selected intervals of time.

2. The oscillator apparatus as defined in claim 1 wherein one extremity of said primary winding of said transformer is maintained at radio-frequency ground and said means responsive to said gating signal includes a p-n-p type transistor having an emitter, a collector and a base, said collector being connected through a first resistor to the remaining extremity of said primary winding, said emitter being connected through a second resistor to ground and said base being responsive to said gating signal and to said oscillations generated by said bridge circuit.

3. The oscillator apparatus as defined in claim 2 wherein the secondary winding of said transformer is bifilar and has an intermediate tap connected to ground and which additionally includes a variable capacitor connected across said secondary winding for adjusting the location of said resonant characteristic within the frequency spectrum.

4. The oscillator apparatus as defined in claim 2 wherein said gating signal reverts to a potential level during said selected intervals of time to saturate said p-n-p type transistor thereby to produce a low impedance across said transformer.

5. The oscillator apparatus as defined in claim 1 which additionally includes a first input terminal responsive to a pedestal-shaped waveform which defines a gated interval; means coupled to said first input terminal for differentiating said pedestal-shaped waveform thereby to generate said trigger input pulse of one polarity and a subsequent trigger input pulse of a polarity opposite to said one polarity; and wherein said means responsive to a trigger input pulse for generating an energizing waveform having a voltage excursion in one direction concurrently with said trigger input pulse and a subsequent voltage excursion in a direction opposite to said one direction in an interval of time substantially equal to one-quarter period at said predetermined frequency includes a blocking oscillator responsive to said trigger input pulse of said one polarity for generating said energizing waveform in response to said trigger input pulse; and a unidirectional device disposed intermediate said blocking oscillator and said means for differentiating said pedestal-shaped waveform for isolating said subsequent trigger input pulse from said blocking oscillator.

6. A gated oscillator apparatus comprising first and second input terminals responsive to first and second bilevel gating signals, respectively, each of said first and second gating signals defining a common interval; means coupled to said first input terminal for differentiating said first gating signal thereby to produce first and second trigger pulses of opposite polarity; a blocking oscillator responsive to said first trigger pulse for generating a pulse of predetermined duration; a bridge network including a crystal capable of being shocked into oscillation at a frequency having a period equal to substantially four times said predetermined duration; a resonant transformer coupled to said bridge network and responsive to said pulse of predetermined duration for shocking said crystal into oscillation in response thereto thereby to provide control oscillations; means including a transistor amplifier stage responsive to said control oscillations and having an output coupled back to said crystal for applying a regenerative feedback signal thereto, said control oscillations being of sufficient magnitude to saturate said transistor amplifier stage whereby said regenerative feedback signal has a substantially constant amplitude; and means having an input coupled to said second input terminal and being responsive to said control oscillations and having an output coupled across said resonant transformer for developing a degenerative feedback signal thereacross at the termination of said common interval.

References Cited by the Examiner

UNITED STATES PATENTS

| | | | |
|---|---|---|---|
| 2,454,132 | 11/48 | Brown | 331—165 |
| 2,625,652 | 1/53 | Krulikoski et al. | 331—54 |
| 3,056,890 | 10/62 | Stoops et al. | 331—165 |

ROY LAKE, *Primary Examiner.*